(12) United States Patent
Bylsma et al.

(10) Patent No.: US 6,252,251 B1
(45) Date of Patent: Jun. 26, 2001

(54) RAISED PHOTODETECTOR WITH RECESSED LIGHT RESPONSIVE REGION

(75) Inventors: Richard Bendicks Bylsma, Allentown; Dominic Paul Rinaudo, Blandon; Rory Keene Schlenker, Greenwich Township; Walter Jeffrey Shakespeare, Lower Macungie Township, all of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/328,956

(22) Filed: Jun. 9, 1999

(51) Int. Cl.[7] .................................................. H01L 31/00
(52) U.S. Cl. .............................. 257/80; 257/82; 257/184; 257/458; 257/461; 257/465; 257/466
(58) Field of Search ..................................... 257/466, 184, 257/458, 465, 461, 82, 80

(56) References Cited

U.S. PATENT DOCUMENTS

| 4,029,962 | * | 6/1977 | Chapman ............................... 250/338 |
| 4,101,351 | * | 7/1978 | Shah et al. ............................ 148/188 |
| 4,972,244 | * | 11/1990 | Buffet et al. ............................ 357/30 |
| 5,083,173 | * | 1/1992 | Yamada et al. ......................... 357/24 |
| 5,315,128 | | 5/1994 | Hunt et al. .............................. 257/16 |
| 5,552,616 | * | 9/1996 | Kobayashi ............................. 257/184 |
| 5,883,421 | | 3/1999 | Chouikha et al. .................... 257/461 |

FOREIGN PATENT DOCUMENTS

| 557159 | * | 5/1958 | (CA) .................................... 257/466 |
| 0 191 682 | * | 8/1986 | (EP) ..................................... 257/466 |

* cited by examiner

*Primary Examiner*—William Mintel

(57) ABSTRACT

A raised photodetector constructed to define an open channel extending between opposite edges of the photodetector and dimensioned for permitting light from laser to pass therethrough. The photodetector has a light-collecting region disposed in an outward facing wall recessed within the channel for collecting light from the laser.

9 Claims, 3 Drawing Sheets

RAISED PHOTODETECTOR WITH RECESSED LIGHT RESPONSIVE REGION

BACKGROUND OF THE INTENTION

1. Field of the Invention

The present invention relates to semiconductor devices and, more particularly, to a raised photodetector having a channel for guiding light therethrough and a light responsive region recessed within the channel for detecting light.

2. Description of the Related Art

The development of integrated optical circuits has become the subject of increased interest in the field of telecommunications. For example, feedback control of lasers in an optical system is of paramount importance as users demand more and more reliable data transmission for a given bandwidth. However, a number of difficulties have been encountered in monitoring lasers, as the monitoring mechanism itself introduces unacceptable signal losses to the optical system.

Prior art techniques require the positioning of a beam splitter along the propagation path of light from a laser so as to divert a portion of the laser light for feedback monitoring. Beam splitters may for example be constructed of dichroic mirrors, i.e. mirrors which transmit one wavelength or a range of wavelengths and reflect the remaining wavelengths. Alternatively, they may be constructed of partially reflecting mirrors which reflect a portion of the incident light and transmit the remaining portion. In any event, such beam splitting causes the output beam from the lasers to incur signal losses that are unacceptable in optical communication applications. Furthermore, beam splitters undesirably increase the number of parts in an optical system and add to its complexity, thereby increasing the cost of the system.

Accordingly, there is a need for a compact, low-cost light detecting device for monitoring light from a laser without requiring the use of a beam splitter.

SUMMARY OF THE INVENTION

It is a therefore an object of the invention to provide a photodetector which can monitor light emitted from a laser without requiring use of a beam splitter.

In accordance with a presently preferred embodiment of the invention, a raised photodetector is constructed so as to define a groove or channel extending between opposite edges of the photodetector and dimensioned for permitting a beam of light to pass therethrough. The photodetector has a light-collecting region disposed centrally in an outward facing wall recessed within the groove or channel for collecting light from an adjacent laser. Preferably, the walls defining the channel have an anti-reflection coating or film deposited thereon.

A preferred embodiment of the inventive method includes the steps of providing an InP substrate having a first side and a second side; forming an InP buffer layer on the first side of the InP substrate; forming a light absorbing layer of InGaAs on the InP buffer layer; forming another InP layer on the light absorbing layer; selectively masking said another InP layer so as to define an unmasked area having a preselected width and extending between opposite edges of the InP substrate; etching the unmasked area so as to form a channel extending through said another InP layer and having a preselected depth h; forming a light collecting region in said another InP layer and the light absorbing layer; forming an anti-reflection film on the walls defining the channel; forming a p side electrode on said another InP layer; and forming an n side electrode on the second side of the substrate.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote similar elements throughout the several views.

DETAILED DESCRIPTION OF THE CURRENTLY PREFERRED EMBODIMENTS

Figure 1:
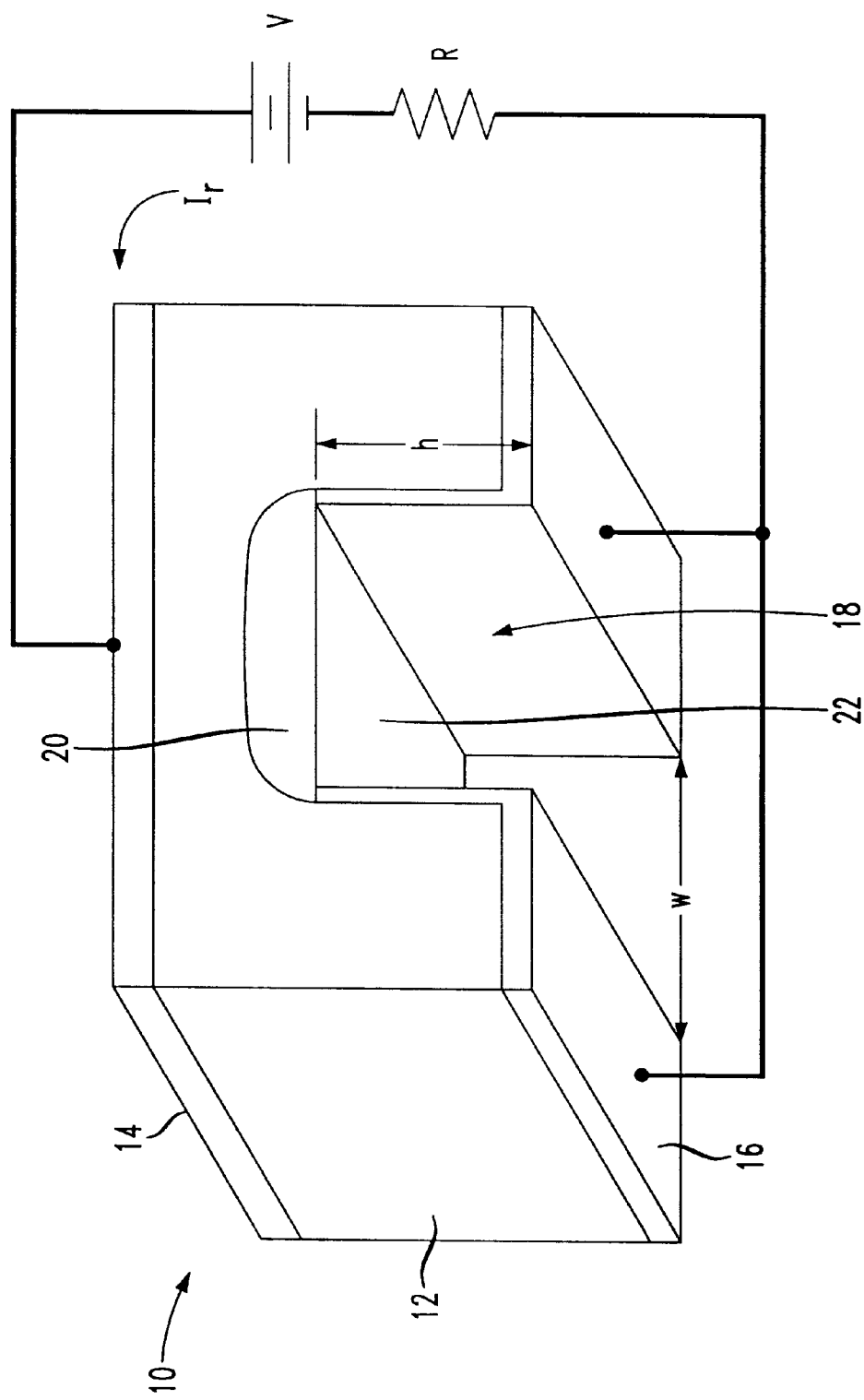
FIG. 1 is a perspective sectional view of a generic raised photodetector in accordance with the present invention.

Referring now to the drawings, depicted in FIG. 1 is a generic construction of the raised photodetector of the present invention. As will be apparent to a person of ordinary skill in the art from this disclosure, the inventive photodetector may be formed as, for example, a pin photodetector, an avalanche photodetector or any other art-recognized photodetector. As exemplarily depicted, the photodetector 10 includes a layer of n-type semiconductor material 12, an n side electrode 14, a p side electrode 16, and a channel 18 having a width w and depth h and extending between opposite edges of the photodetector 10. The n-type semiconductor layer 12 may be intrinsic or extrinsic. The channel is preferably configured so as to have a substantially rectangular cross-section, although it may alternatively be of other geometric shapes such, for example, as arcuate or arch-like. As will be apparent from this disclosure, the channel is dimensioned to guide or accommodate a predetermined amount of light (from, e.g. a laser) to pass therethrough.

Advantageously, a light responsive region 20, i.e. a p type region, is formed in at least a portion of an outward facing wall 22 of the channel 18 for detecting light or optical signals incident thereon. Specifically, the outward facing wall 22 is oriented so as to receive light traveling at an angle, preferably substantially perpendicular, to the light passing through channel 18. The photodetector so constructed has a unique capability to permit light from a laser to travel unimpeded therethrough, i.e. through and along the channel 18 and to detect a portion of the light from the same laser without requiring use of a separate beam splitter which, as discussed above, would increase the cost and complexity of an optical subassembly (OSA) and diminish usable signal amplitude.

In accordance with an aspect of the invention, the light responsive region 20 may be formed by diffusing a p-type dopant impurity into the n-type semiconductor material 12 which may, for example, be InP. Where the semiconductor material is InP, the p-type dopant impurity may include, by way of example, Zn, Cd, Mg, and/or Be. In any event, the particular combination and/or concentration of dopant impurity and semiconductor material may be chosen so that the photodetector 10 is sensitive to a particular region of the spectrum and/or photons with energies at or near a predetermined level of band gap energies. The inventive photodetector can thus be selectively tailored to a specific application.

In use, the photodetector 10 may be connected to a resistance R and a voltage source V such that a reverse biased current $I_r$ flows in a direction (as indicated in FIG. 1) so that the p side electrode 16 becomes negative and the n side electrode 14 becomes positive. A depletion region is thereby created at the p-n junction plane between p-type region 20 and n-type region 12. When p-type region 20 receives photons of sufficient band gap energies, a photoelectric current is generated proportional to the quantity of photons received. Analysis of the photoelectric current will enable the user to determine the various performance parameters of the laser.

Figure 2:
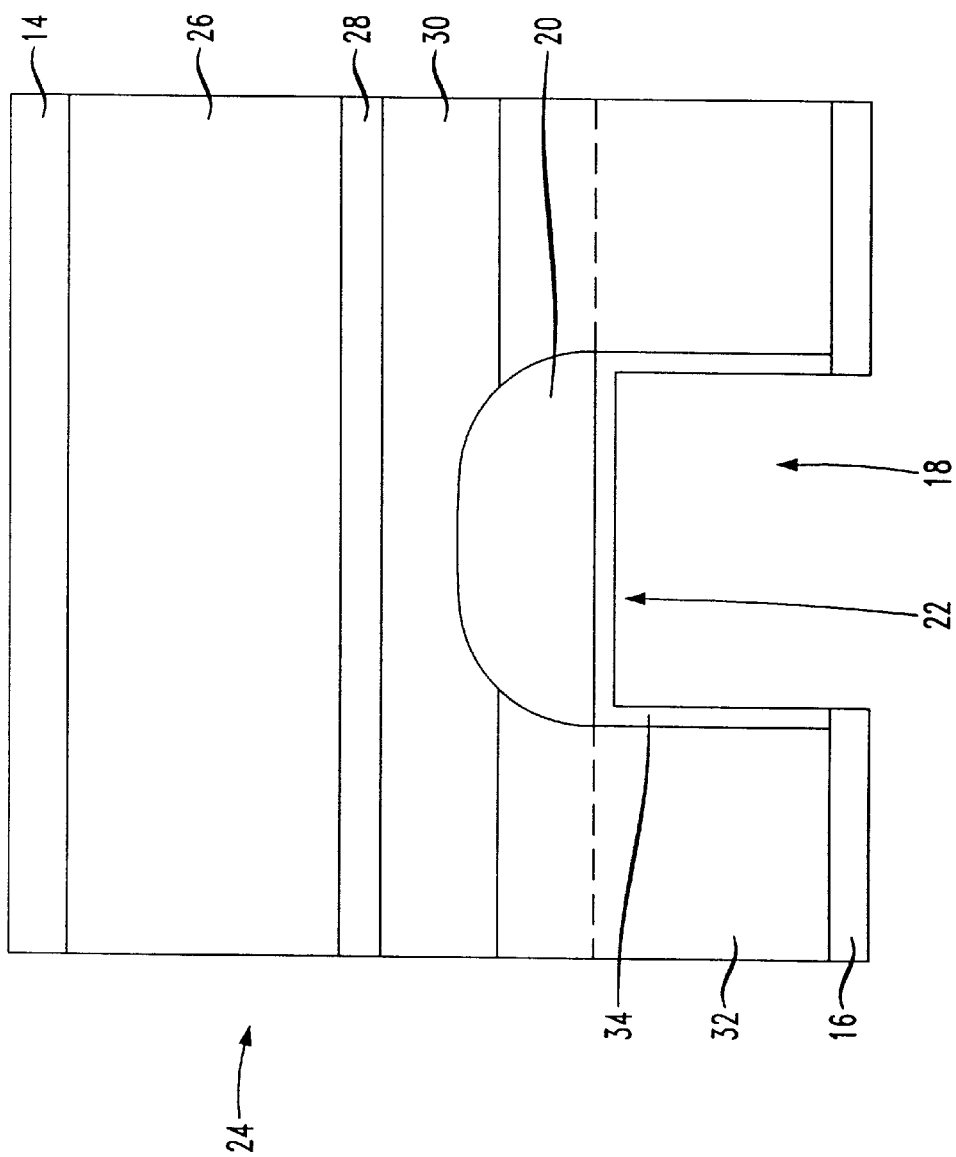
FIG. 2 is a sectional end view of a preferred embodiment of the raised photodetector of the present invention.

FIG. 2 depicts a pin type photodetector 24 constructed in accordance with a preferred embodiment of the invention. The photodetector 24 includes an n-type side electrode 14, an InP substrate 26, an InP buffer layer 28, a light absorbing layer 30 (i.e. an "i"-type region), an InP window layer 32, a light responsive region 20, and a p-type side electrode 16. A channel 18 is defined in the InP window layer 32 for permitting light to pass therethrough. The configuration and cross sectional area sizing of channel 18 are based on, for example, the dispersion pattern of a laser beam intended for use with the photodetector 24.

The light responsive region 20 is formed in the outward facing wall 22 of channel 18 and extends to the light absorbing layer 30, which is preferably formed of InGaAs. The surface area of light responsive region 20 is selected to collect the requisite amount of light from the laser for monitoring and/or other suitable purposes. Light responsive region 20 may extend along the full length of channel 18 or along only a portion thereof as a matter of design choice.

An anti-reflection film 34 or coating such, for example, as SiN may be deposited on the walls defining channel 18 to enhance light absorption by the p-type region 20.

The photodetector 24 may, by way of example, be fabricated in the following manner. First, the InP buffer layer 28, the InGaAs layer 30, and the InP window layer 32 are successively deposited or grown on the substrate 26 using techniques such, for example, as molecular beam epitaxy, or MOCVD. Next, a photoresist mask is photolithographically defined on the InP window layer 32 and is patterned to define an unmasked region extending between opposite edges of substrate 26. The width of this unmasked region is the width of the to-be-created channel 18 for guiding and detecting light. The unmasked region is then chemically etched using, for example, hydrofluoric acid to remove select amounts of the InP window layer 32 so as to form and define the desired channel depth. Next, the light responsive region 20 or p-type region is formed by, for example, diffusing a sufficient concentration of p-type dopant impurities (e.g. Zn) into the now-exposed surfaces of the InP window layer 32 that define channel 18. The p-type region 20 should have a depth which reaches the InGaAs layer 28. The photoresist mask is then removed from the InP window layer 32. A p-side electrode 16 is selectively deposited on the bonding surfaces of the InP window layer 32 and on the walls defining the channel except for the outward facing wall 22 of channel 18. An anti-reflection film or coating 34 such, for example, as SiN is deposited on that portion of the p-side electrode 16 which lines the walls of channel 18. Finally, an n-side electrode 14 is formed on the uncoated side of substrate 26 and bonding pads may optionally be formed on one or both of the electrodes.

It is contemplated that more than one channel 18 may be formed in the photo detector 24. Thus, for example, the photodetector 24 may further include a second channel oriented and extending substantially orthogonal to channel 18 for receiving and passing therethrough a second beam of laser light. The second channel forms an intersection with channel 18 such that the inward facing wall 22 is positioned substantially at or proximate the intersection.

In any event, in operation, when a reverse bias current flows between the p-side and n-side electrodes 16, 14 and light is incident or directed onto the light responsive region 20, carriers are excited in the InGaAs light absorbing layer 30, and a photoelectric current flows in accordance with the quantity of light incident on the outward facing wall of the channel.

Figure 3:
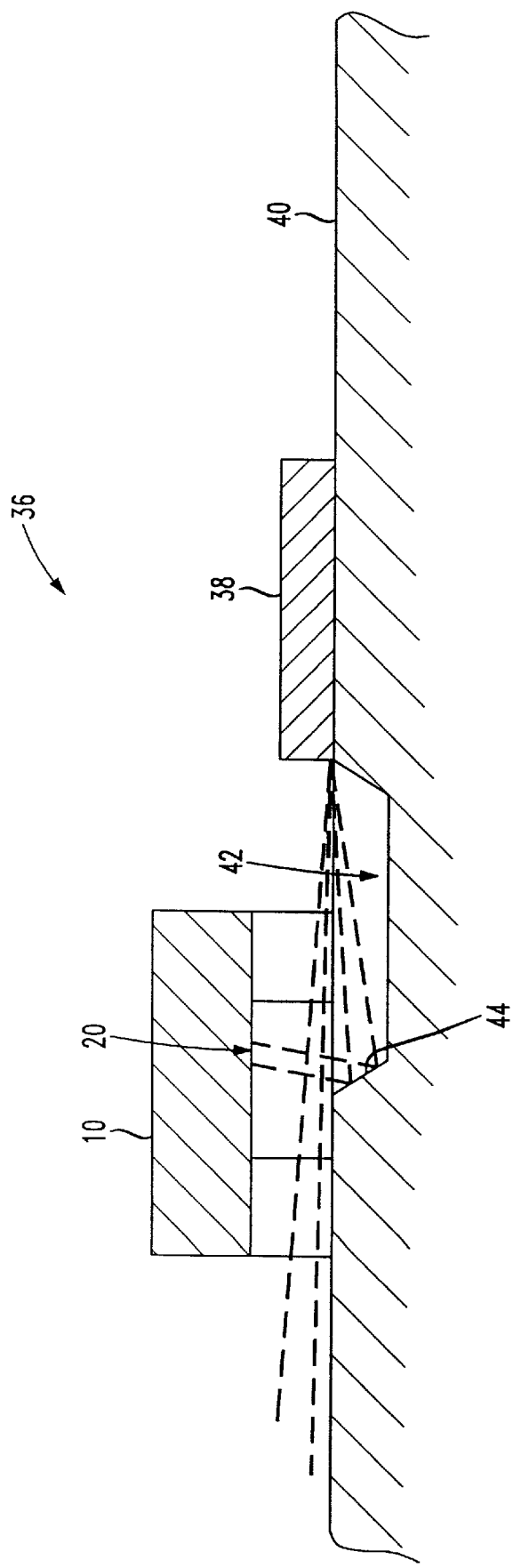
FIG. 3 is a sectional side view of an optical subassembly constructed in accordance with the present invention.

The inventive photodetector 10 or 24 is generally contemplated and intended for advantageous use as part of an optical subassembly 36. As shown by way of illustration in FIG. 3, such an optical subassembly 36 includes a laser such, for example, as an edge emitting laser 38, and an embodiment of the inventive photodetector 10 mounted to a silicon wafer 40. A groove or recess 42 is formed in the silicon wafer 40 and extends between the laser 38 and photodetector 10. The groove 42 is configured to include an upwardly inclined surface 44 so positioned and dimensioned that a portion of the light emitted from the laser and directed toward the channel 18 and groove 42 is reflected by inclined surface 44 onto the light responsive region 20 recessed in channel 18 of the photodetector 10. As shown in FIG. 3, in this embodiment, the inclined surface 44 is disposed directly below the light responsive region 20 of photodetector 10 and is oriented so that light incident on surface 44 is reflected onto the light responsive region 20 along a path substantially perpendicular to region 20. As will be readily apparent to the ordinary artisan from this disclosure, implementation of the inventive photodetector in an OSA will eliminate the need for a separate beam splitter, thereby resulting in a more compact and low cost OSA and improving signal amplitude.

While there have shown and described and pointed out fundamental novel features of the invention as applied to preferred embodiments thereof, it will be understood that various omissions and substitutions and changes in the form and details of the devices illustrated, and in their operation, and in the methods described may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A photodetector for detecting and transmitting light therethrough, comprising:

a semiconductor layer comprising an n-type material, said semiconductor layer having a first side and a second side opposite said first side, and a first edge and a second edge opposite said first edge;

a channel defined on said first side of the semiconductor layer and extending between said first and said second edges to form a through passage to permit a predetermined amount of light to pass therethrough, said channel having an outward facing wall recessed within said channel;

a light responsive region comprising a p-type dopant impurity formed in said outward facing wall of said channel and extending to a predetermined depth to thereby form a p-n junction in said semiconductor layer;

a p-side electrode connected to said light responsive region; and an n-side electrode connected to said second side of the semiconductor layer so that when a reverse bias current flows from said n-side electrode to said p-side electrode and light is incident on said light responsive region, a photoelectric current is generated in accordance with the movement of light incident on said light responsive region.

2. The photodetector of claim 1, further comprising a light absorbing layer disposed at said predetermined depth in said light responsive region of the semiconductor layer.

3. The photodetector of claim 2, wherein said semiconductor layer comprises InP.

4. The photodetector of claim 2, wherein said p-type dopant impurity includes Zn.

5. The photodetector of claim 2, wherein said light absorbing layer comprises InGaAs.

6. The photodetector of claim 2, wherein said p-side electrode and said n-side electrode are disposed on said first and said second sides, respectively, of said semiconductor layer.

7. The photodetector of claim 6, wherein each of said p-side electrode and said n-side electrode comprises a metal.

8. The photodetector of claim 1, further comprising an antireflection film disposed on the outward facing wall of the channel.

9. The photodetector of claim 1, wherein said semiconductor layer has a third edge and a fourth edge opposite said third edge, and the photodetector further comprises another channel defined on said first side of the semiconductor layer and extending between said third and said fourth edges to form another through passage to permit a predetermined amount of light to pass therethrough, said another through passage forming an intersection with said through passage of said channel such that said outward facing wall is positioned substantially at said intersection.

* * * * *